United States Patent
Sugiyama et al.

[19]

[11] Patent Number: 6,080,445

[45] Date of Patent: Jun. 27, 2000

[54] METHOD OF FORMING FILMS OVER INSULATING MATERIAL

[75] Inventors: Osamu Sugiyama; Yukio Miya; Ryota Koike; Takashi Toida, all of Tokorozawa, Japan

[73] Assignee: Citizen Watch Co., Ltd., Tokyo, Japan

[21] Appl. No.: 09/040,243

[22] Filed: Feb. 19, 1998

[30] Foreign Application Priority Data

Feb. 20, 1997 [JP] Japan .................................. 9-036128

[51] Int. Cl.$^7$ .................................................. C23C 16/26
[52] U.S. Cl. .................................. 427/249.7; 427/255.7;
427/122; 427/404; 427/419.7; 427/902
[58] Field of Search ............................ 427/249.7, 255.7,
427/902, 404, 122, 249.18, 249.19, 250,
419.7; 428/408

[56] References Cited

U.S. PATENT DOCUMENTS

| | | | |
|---|---|---|---|
| 4,842,937 | 6/1989 | Meyer et al. | 428/408 |
| 5,232,568 | 8/1993 | Parent et al. | 204/192.3 |

FOREIGN PATENT DOCUMENTS 2-30761  2/1990  Japan .

*Primary Examiner*—Roy V. King
*Attorney, Agent, or Firm*—Armstrong, Westerman, Hattori, McLeland & Naughton

[57] ABSTRACT

A method of forming films over an insulating material is provided whereby an underlayer film having electric conductivity is formed on the surface of the insulating material constituting a base member, and a hard carbon film is formed over the underlayer film so that the surface electrical resistance value of the hard carbon film can be controlled so as not to cause the surface thereof to be charged with static electricity by varying an electrical resistance value of the underlayer film. In the case where the underlayer film is formed of a metal film composed of titanium, chromium, tungsten, or the like, the resistance value thereof can be changed by varying the thickness of the metal film. In the case where the underlayer film is formed of a semiconductor film composed of silicon, germanium, or the like, the resistance value thereof can be changed by varying the thickness of the semiconductor film, or the concentration of an impurity added thereto.

22 Claims, 11 Drawing Sheets

METHOD OF FORMING FILMS OVER INSULATING MATERIAL

BACKGROUND OF THE INVENTION

1. Field of the Invention

The invention relates to a method of forming films over an insulating material in order to enhance wear resistance of the insulating material and further to control a surface electrical resistance value thereof at a desired value by forming a hard carbon film on the surface thereof.

2. Description of the Related Art

It has lately become a common practice to form a hard carbon film as a protective film on the surface of a base member composed of materials such as metal, glass, ceramic, plastics, or the like, for enhancement in wear resistance of the surface and improvement in durability thereof.

A hard carbon film is a hydrogenated amorphous carbon film blackish in color and having properties similar to those of diamond. It is therefore called a diamond-like carbon (DLC) film, or an i-carbon film.

The hard carbon film has excellent characteristics such as high mechanical hardness, a low friction coefficient, excellent electrical insulation, high thermal conductivity, and high corrosion resistance.

Accordingly, coating of decorative articles, medical equipment, magnetic heads, tools, or the like with the hard carbon film for significantly enhancing durability thereof has been proposed and put to practical use.

Further, in a system for manufacturing semiconductor devices such as LSIs (Large Scale Integrated circuits) and the like, an insulating material such as ceramic instead of metal is used for jigs, tools, and the like for handling semiconductor wafers and chips, such as a transfer arm and the like for transferring semiconductor wafers and chips so as not to contaminate the semiconductor wafers and chips, and coating of the surfaces of the jigs, tools, and the like, composed of the insulating material, with the hard carbon film has been proposed to enhance wear resistance of the surfaces thereof.

However, as the hard carbon film has high electric resistivity, the surface of the base member, if coated with the hard carbon film, comes to have a very high surface electrical resistance value.

As a result, the surfaces of the jigs, tools, and the like are prone to generate static electricity upon contact with other members of the manufacturing system, thereby creating a problem in that the surfaces are prone to attract contaminants and dust in the atmosphere.

Further, in the case of the hard carbon film being formed over the surface of the transfer arm for transferring semiconductor wafers and chips, and the like, the following problem will arise in addition to the problem of contaminants and dust adhering to the surface due to the effect of static electricity.

For example, in the case where semiconductor wafers and chips provided with a multitude of semiconductor integrated circuit elements integrated thereon are handled, electrostatic destruction of a gate insulation film of, for example, a MOS transistor, caused by static electricity with which the surfaces of jigs, tools, and the like handling semiconductor wafers and chips are charged will pose a serious problem because the gate insulation film is very thin due to advanced integration of the semiconductor integrated circuit.

FIG. 13 is a graph showing an example of measurement results with reference to surface electrical resistance values of a hard carbon film, wherein the abscissa indicates the thickness of the hard carbon film and the ordinate indicates resistance between terminals, that is, surface electrical resistance values.

As samples used for measuring the surface electrical resistance value of the hard carbon film, five types of samples with a hard carbon film 0.1 $\mu$m, 0.4 $\mu$m, 0.8 $\mu$m, 1.2 $\mu$m, and 1.5 $\mu$m thick, respectively, formed on respective borosilicate glass plates 1.1 mm thick were prepared. Measurement results thereof are plotted as shown by a curve 36.

Now, a method of measuring the surface electrical resistance value is described with reference to FIG. 14. As shown in FIG. 14, a pair of measurement terminals 22a, 22b, disposed at a predetermined spacing (1 mm), are brought into contact with the surface of each sample provided with a hard carbon film 16 formed on the respective borosilicate glass plates, which is a base member 12.

Then, a DC power source 18 and an ammeter 20 are connected to the measurement terminals 22a, 22b in series. A DC voltage at 50 V supplied from the DC power source 18 is applied between the measurement terminals 22a and 22b, and the amperage of current flowing through the measurement terminals 22a, 22b is measured by means of the ammeter 20, finding the surface electrical resistance value of the hard carbon film 16 by calculation.

As shown by the curve 36 of the graph in FIG. 13, the surface electrical resistance value of the hard carbon film 16 is on the order of $10^{11}$ $\Omega$. Further, it has been found that the thicker the thickness of the hard carbon film 16, the smaller the surface electrical resistance value becomes. This is presumably attributable to an increase in amperage of current flowing through the hard carbon film as the thickness thereof increases.

Thus, the surface electrical resistance value of the hard carbon film formed on the surfaces of the jigs, tools, and the like composed of the insulating material is as high as on the order of $10^{11}$ $\Omega$. Hence, there is a risk of the surfaces thereof, charged with static electricity, attracting contaminants and dust, or causing electrostatic destruction to occur due to the static electricity when semiconductor wafers and chips are handled.

Therefore, the merits of the hard carbon film can not be fully utilized, and consequently, jigs, tools, and, the like, provided with the hard carbon film for use in handling semiconductor wafers and chips, the surfaces of which are not charged with static electricity, are in great demand.

Accordingly, as disclosed in, for example, Japanese Patent Laid-open Publication No. 2-30761, and the like, a proposal has been made wherein electric conductivity of a hard carbon film is controlled by causing a halogen, or hydrogen and halogen, to be contained in the hard carbon film formed on the surface of a base member made of a metal or an insulating material such that the concentration of the halogen is distributed depthwise in the hard carbon film deposited on the surface of the base member.

That is, when forming the hard carbon film by means of the plasma CVD method, a halogen such as F, Cl, Br, I, or the like is added by supplying to a plasma a fluoride such as $NF_3$, $SF_4$, $WF_6$, or the like, a chloride such as $CCl_4$, or the like, a bromide such as $CH_3Br$, or an iodide, as feed material for the halogen.

By forcing a halogen to be contained in the hard carbon film as described above, it is possible to improve electric conductivity of the hard carbon film, and to lower the surface electrical resistance value thereof. However, another problem will ensue from this in that the characteristics of the hard carbon film such as hardness and the like are deteriorated, and the merits thereof such as enhanced wear resistance is impaired.

Further, another proposal has also been made wherein a film composed of a metal such as W, Ni, or the like is formed by, for example, the sputtering process, during the formation of the hard carbon film, forming the hard carbon film containing metal particles so that the surface electrical resistance value is lowered.

With this method, however, since the metal particles are mixed into the hard carbon film, it is unavoidable that the characteristics thereof such as hardness and the like are deteriorated, and the beneficial effects such as enhanced wear resistance are impaired. Furthermore, in this case, process control during a process of forming films as well as accurate control of the surface electrical resistance value is difficult to achieve.

SUMMARY OF THE INVENTION

It is therefore an object of the invention to provide a method of forming films over an insulating material whereby a hard carbon film is formed on the surface of the insulating material such that a surface electrical resistance value of the hard carbon film can be controlled in such a way as not to cause the surface thereof to be charged with static electricity without impairing the hardness thereof, solving all the problems described in the foregoing.

To this end, the method of forming films over the insulating material according to the invention comprises the steps of forming an underlayer film having high electric conductivity on the surface of the insulating material such as glass, ceramic, and the like, and forming the hard carbon film over the underlayer film, a surface electrical resistance value of the hard carbon film being controlled by varying an electrical resistance value of the underlayer film.

A metal film or a semiconductor film may be formed as the underlayer film. In the case of a metal film being used, the electrical resistance value of the underlayer film can be changed by varying the thickness of the metal film or type of the metal therefor. In the case a the semiconductor film being used, the electrical resistance value of the underlayer film can be changed by varying the thickness of the semiconductor film, type of the semiconductor therefor, or concentration of an impurity (dopant).

Also, a first underlayer film of a metal film may be formed on the surface of the insulating material, and a second underlayer film of a semiconductor film may be formed over the first underlayer film, the two films constituting the underlayer film.

In such a case, the electrical resistance value of the underlayer film can be changed by varying either the thickness of the first underlayer film of the metal film, or the thickness or the concentration of an impurity of the second underlayer film of the semiconductor film.

The metal film as the underlayer film may be formed of a metal selected from the group consisting of titanium, chromium, tungsten, or a carbide and nitride of one of said metals. Further, the semiconductor film as the underlayer film may be formed of a material selected from the group consisting of silicon, germanium, or a compound of silicon or germanium.

It is more preferable to form a first underlayer film of a metal film on the surface of the insulating material, a second underlayer film of a metal film having higher electric conductivity than that of the metal film over the first underlayer film, and furthermore, a third underlayer film of a semiconductor film over the second underlayer film, the three films constituting the underlayer film formed between the insulating material and the hard carbon film.

In this case, the surface electrical resistance value of the underlayer film can be changed primarily by varying the thickness of the second underlayer film.

Further, the first underlayer film may be formed of a metal selected from the group consisting of titanium, chromium, and tungsten, the second underlayer film may be formed of a metal selected from the group consisting of gold, copper, indium, and aluminum, and the third underlayer film may be formed of either of silicon and germanium.

By forming the hard carbon film on the surface of a jig or tool such as a transfer arm for handling semiconductor wafers or chips with the use of the method of the invention, wear resistance of the surface of the jig or tool, composed of an insulating material such as ceramic, is considerably enhanced, and generation of dust caused by abrasion of the surface can be prevented while the surface electrical resistance value is lowered, keeping the surface from being charged with static electricity, and preventing adsorption of dust to the semiconductor wafers or chips being handled, and occurrence of electrostatic destruction.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of a method of forming films over an insulating material according to the invention will be described in detail hereinafter with reference to the accompanying drawings.

Figure 1:
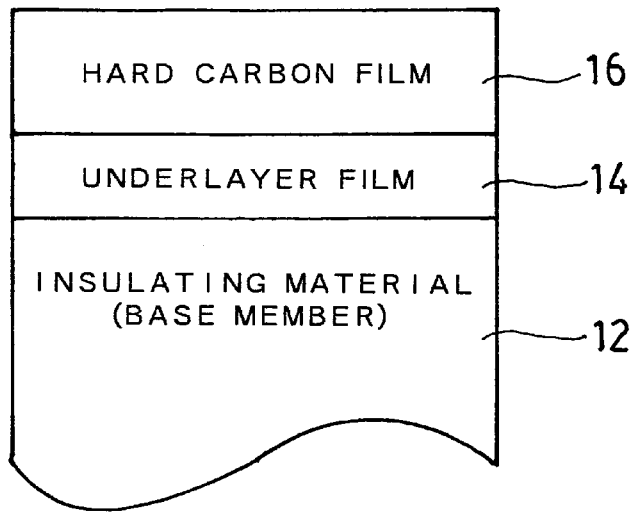
FIG. 1 is a schematic sectional view illustrating the construction of films formed over an insulating material by the first embodiment according to the invention.
Figure 2:
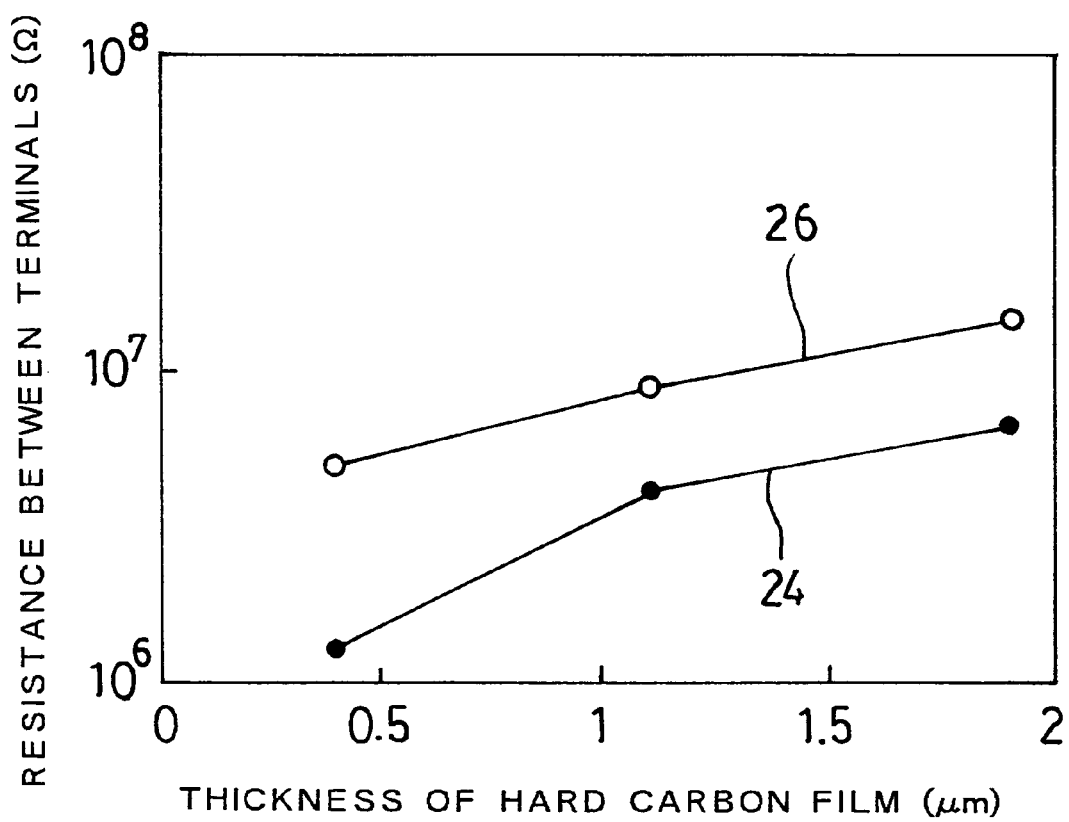
FIG. 2 is a graph showing an example of measurement of surface electrical resistance values and thickness of hard carbon films formed according to the first embodiment.

First Embodiment: FIGS. 1 and 2

FIG. 1 is a schematic sectional view illustrating the construction of films formed over an insulating material by a first embodiment of a method according to the invention.

In the construction shown in FIG. 1, a hard carbon film 16 is provided via an underlayer film 14 formed over an insulating material 12 comprising a base member of various components, jigs, tools, or the like. The insulating material 12 is glass, ceramic, resin (plastics), or the like.

A metal film or semiconductor film as the underlayer film 14 is formed on the surface of the insulating material 12. The underlayer film 14 is formed by means of a physical vapor deposition method, such as the sputtering method, vacuum deposition method or the like, or the CVD (chemical vapor deposition) method.

Then, the hard carbon film 16 is formed over the underlayer film 14. The hard carbon film 16 is formed by means of the plasma CVD method using methane ($CH_4$) as feed gas.

In the case of a metal film being used for the underlayer film 14, titanium (Ti), chromium (Cr), tungsten (W), or the like may be used to form the metal film. Further, a compound such as a carbide, nitride, or the like of one of these metals can also be used for the underlayer film 14.

In the case of a semiconductor film being used for the underlayer film 14, silicon (Si) or germanium (Ge) may be used. Further, a compound of silicon or germanium may also be used for the underlayer film 14.

The surface electrical resistance value of the hard carbon film 16 can be controlled by varying the electrical resistance value of the underlayer film 14.

In the case of the underlayer film 14 being a metal film, the electrical resistance value thereof can be varied by changing the kind of a metal used, chemical composition of a compound such as a carbide, nitride, or the like of the metal, or the thickness of the metal film used.

In the case of the underlayer film 14 being a semiconductor film, the electrical resistance value thereof can be varied by changing the type of semiconductor used, the thickness of the semiconductor film used, or the concentration of an impurity introduced into the semiconductor film. Phosphorus (P), boron (B), and arsenic (As) are among the impurities that may be introduced into the semiconductor film.

The impurities are introduced in the semiconductor film concurrently during the formation of the semiconductor film. For example, in the case where phosphorus is introduced into a silicon film through the CVD process, monosilane ($SiH_4$) as feed gas for silicon, and phosphine ($PH_3$), are fed into a CVD chamber.

The surface electrical resistance value of the hard carbon film 16 covering the insulating material 12 in this way can be reduced to a desired value at which the surface of the hard carbon film 16 will not become charged with static electricity.

A specific example of the first embodiment of the invention is described with reference to the graph in FIG. 2.

The graph shown in FIG. 2 indicates surface electrical resistance values of the hard carbon film 16 when the same is formed over the upper surface of a n-type silicon film (semiconductor film) formed, as the underlayer film 14, on the surface of the insulating material 12 shown in FIG. 1, for which glass is used.

Three types of samples provided with a hard carbon film 0.4 $\mu$m, 1.1 $\mu$m, and 1.9 $\mu$m thick, respectively, were prepared, and electrical resistance values of the respective samples between the measurement terminals were measured, plotting the measurement results in FIG. 2. That is, the abscissa indicates thickness of the hard carbon film and the ordinate thereof indicates resistance between terminals, that is, the surface electrical resistance values, in FIG. 2.

The curve 26 indicates the case of a silicon film, as an underlayer film, having specific resistance in the range of 1 to 5 $\Omega$/m (in this case, the concentration of the impurity was from $9\times10^{14}$ to $5\times10^{15}$ atoms/cm$^3$) while the curve 24 indicates a case of a silicon film having specific resistance in the range of 10 to 20 $\Omega$/cm (in this case, the concentration of the impurity was from $2.5\times10^{14}$ to $5\times10^{14}$ atoms/cm$^3$).

More specifically, the hard carbon film was formed on the silicon films having differing specific resistances, respectively, and the surface electrical resistance values of the hard carbon film in respective cases were measured. The method of measuring the surface electrical resistance value was the same as previously described with reference to FIG. 14. The results of measurement shown in FIG. 2, however, were obtained by applying a DC voltage at 10 V supplied from the DC power source 18 in FIG. 14.

As is evident from the curves 24 and 26 shown in FIG. 2, the surface electrical resistance value of the hard carbon film can be controlled by varying the specific resistance of the silicon film, that is, the underlayer film underneath the hard carbon film. It has been found from comparison of the curve 26 for the case of the silicon film having a specific resistance in the range of 1 to 5 $\Omega$/cm with the curve 24 for the case of the silicon film having a specific resistance in the range of 10 to 20 $\Omega$/cm that the surface electrical resistance value of the hard carbon film 1.1 $\mu$m thick was $9\times10^6$ $\Omega$, and $4\times10^6$ $\Omega$, respectively.

Figure 13:
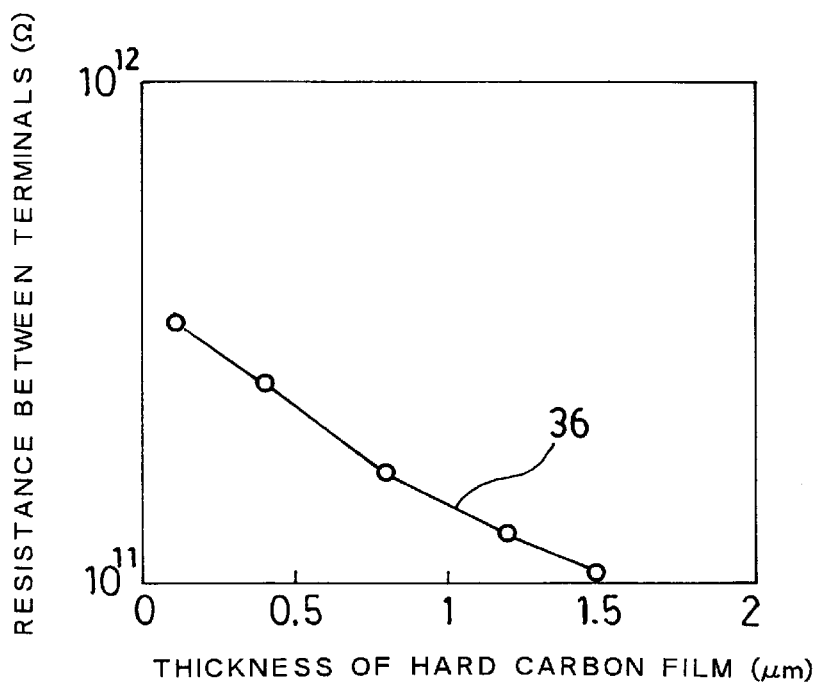
FIG. 13 is a graph showing an example of measurement of surface electrical resistance values of a hard carbon film formed on the surface of an insulating material according to the conventional method.

This shows therefore that the surface electrical resistance value of the hard carbon film can be controlled by varying the electrical resistance value of the underlayer film. Further, the surface electrical resistance value of the hard carbon film in this case was found to be on the order of $10^6$ $\Omega$, significantly lower than the surface electrical resistance value (on the order of $10^{11}$ $\Omega$) of the conventional hard carbon film shown in FIG. 13.

Figure 3:
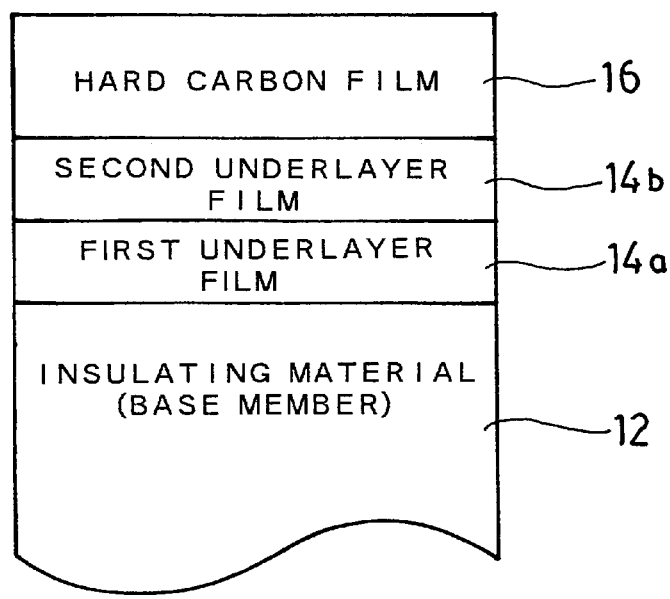
FIG. 3 is a schematic sectional view illustrating the construction of films formed over an insulating material by the second embodiment according to the invention.
Figure 4:
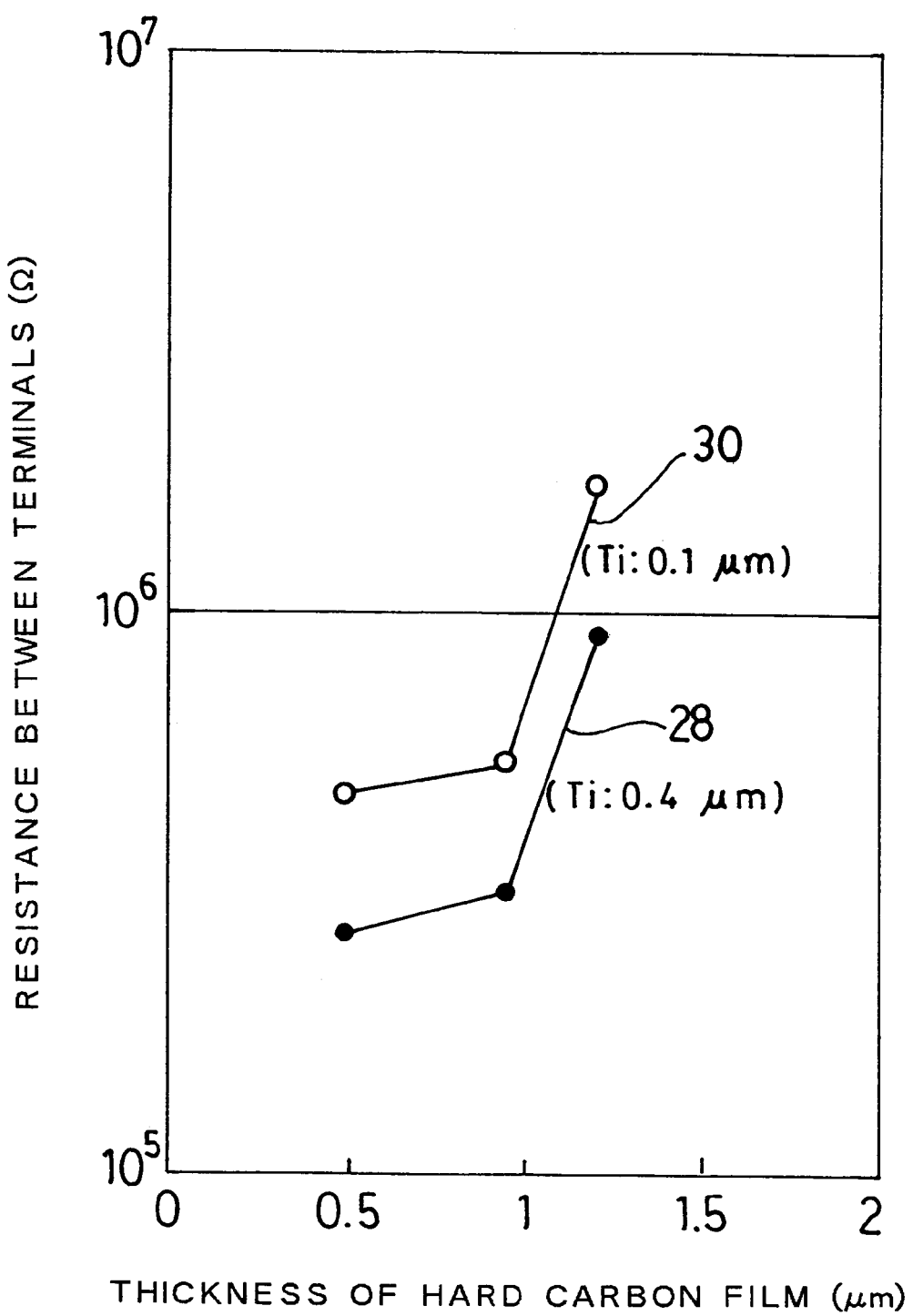
FIG. 4 is a graph showing an example of measurement of surface electrical resistance values and thickness of hard carbon films formed according to the second embodiment.

Second Embodiment: FIGS. 3 and 4

Next, a second embodiment according to the invention will be described hereinafter. FIG. 3 is a schematic sectional view illustrating the construction of the films formed over an insulating material.

In the construction shown in FIG. 3, a hard carbon film 16 is provided via a first underlayer film 14a and second underlayer film 14b formed over an insulating material 12 comprising a base member of various components, jigs, tools, or the like. The insulating material 12 is glass, ceramic, resin (plastics), or the like.

For the first underlayer film 14a, a metal film composed of a metal selected from the group consisting of titanium (Ti), chromium (Cr), tungsten (W), or a compound such as a carbide, nitride, or the like of one of the aforesaid metals is formed on the surface of the insulating material 12.

For the second underlayer film 14b, a semiconductor film composed of silicon (Si), germanium (Ge), or the like is formed over the first underlayer film 14a.

The underlayer films 14a, 14b are formed by means of a physical vapor deposition method such as the sputtering method, vacuum deposition method or the like, or the CVD (chemical vapor deposition) method as previously described with reference to the first embodiment of the invention.

With the construction of the films shown in FIG. 3, the surface electrical resistance value of the hard carbon film can be controlled by varying the electrical resistance value of either or both of the first underlayer film 14a and the second underlayer film 14b.

The electrical resistance value of the first underlayer film 14a can be varied by changing the kind of metal constituting the metal film, chemical composition of the carbide, nitride, or other compound of the metal, or the thickness of the metal film.

The electrical resistance value of the second underlayer film 14b can be varied by changing the type of semiconductor constituting the semiconductor film, the thickness of the semiconductor film, or the concentration of the impurity added to the semiconductor film.

The surface electrical resistance value of the hard carbon film 16 covering the insulating material 12 in this way can be reduced with greater ease to a required value at which the surface of the hard carbon film 16 will not be charged with static electricity.

A specific example of the second embodiment of the invention is described with reference to a graph in FIG. 4.

The graph shown in FIG. 4 indicates electrical resistance between the measurement terminals, that is, surface electrical resistance values of the hard carbon film 16, with the construction of the films being as shown in FIG. 3, wherein glass is used for an insulating material 12 constituting a base member, a titanium film as a first underlayer film 14a is formed on the surface of the insulating material 12, and a silicon film is formed as a second underlayer film 14b over the first underlayer film 14a, forming the hard carbon film 16 over the upper surface of the second underlayer film 14b.

Three types of samples provided with a hard carbon film 0.5 $\mu$m, 0.9 $\mu$m, and 1.2 $\mu$m thick, respectively, were prepared, and electrical resistance values of the respective samples between the measurement terminals were measured, plotting the measurement results in FIG. 4.

In this instance, only the thickness of the titanium film, that is, the first underlayer film 14a, was varied, keeping the thickness of the silicon film, that is, the second underlayer film 14b, constant (at 0.1 $\mu$m).

The curve 28 represents the case of the titanium film being 0.4 $\mu$m thick, wherein the electrical resistance values of the hard carbon film between the measurement terminals were $2.7 \times 10^5$ $\Omega$, $3.2 \times 10^5$ $\Omega$, and $9 \times 10^5$ $\Omega$ for the thickness thereof at 0.5 $\mu$m, 0.9 $\mu$m, and 1.2 $\mu$m, respectively.

The curve 30 represents the case of the titanium film being 0.1 $\mu$m thick, wherein the electrical resistance values of the hard carbon film between the measurement terminals were $4.7 \times 10^5$ $\Omega$, $5.2 \times 10^5$ $\Omega$, and $1.7 \times 10^6$ $\Omega$ for the thickness thereof at 0.5 $\mu$m, 0.9 $\mu$m, and 1.2 $\mu$m, respectively.

In this case, phosphorus was introduced as an impurity into the silicon film which is the second underlayer film 14b. That is, the silicon film which is the second underlayer film 14b was formed by means of the DC sputtering method wherein an n-type silicon material containing phosphorus was used as the target material. As the specific resistance of the n-type silicon material as the target material was around 100 $\Omega$/cm, the second underlayer film 14b had substantially the same specific resistance as that of the silicon material.

Figure 14:
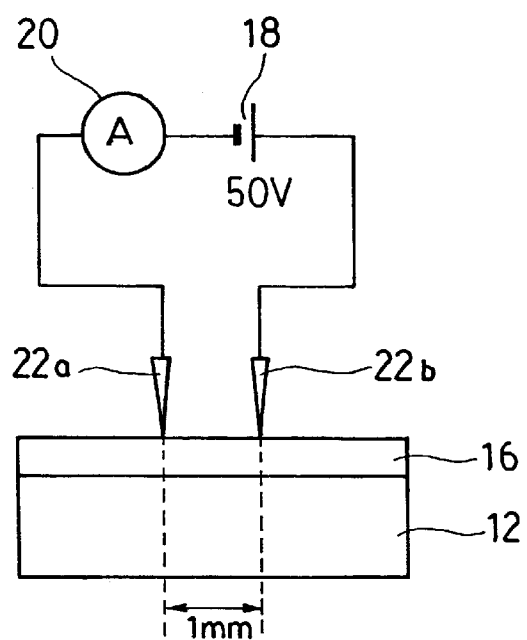
FIG. 14 is a view illustrating a method of measuring surface electrical resistance values of a hard carbon film.

The method of measuring the surface electrical resistance value (resistance between the measurement terminals) of the hard carbon film in this case was the same as previously described with reference to FIG. 14. The results of measurement shown in FIG. 4, however, were obtained by applying a DC voltage at 10 V supplied from the DC power source 18 in FIG. 14.

As is evident from the curves 28 and 30 shown in FIG. 4, the surface electrical resistance value of the hard carbon film can be controlled by varying the thickness of the first underlayer film, that is, an electrical resistance value of the film.

More specifically, it has been found from comparison of the curve 28 for the case of the titanium film, that is, the first underlayer film, being 0.4 $\mu$m thick, with the curve 30 for the case of the same being 0.1 $\mu$m thick, that the surface electrical resistance value of the hard carbon film 0.9 $\mu$m thick was $3.2 \times 10^5$ $\Omega$ and $5.2 \times 10^5$ $\Omega$, respectively.

The values described above are further lower than the surface electrical resistance values of the hard carbon film in the case of the first embodiment as indicated in FIG. 2.

In this embodiment, only the thickness, that is, the electrical resistance value of the titanium film (metal film) which is the first underlayer film 14a, was varied. However, the inventors have confirmed that the same results can also be attained by varying the electrical resistance value of the silicon film (semiconductor film), that is, the second underlayer film 14b. Further, in this case, the electrical resistance value of the silicon film can be varied by changing the thickness thereof, or the concentration of the impurity added thereto.

Still further, the electrical resistance values of both the metal film as the first underlayer film 14a, and the semiconductor film as the second underlayer film 14b may also be varied.

For the insulating material 12, ceramic, plastics, or the like besides glass may alternatively be used.

Figure 5:
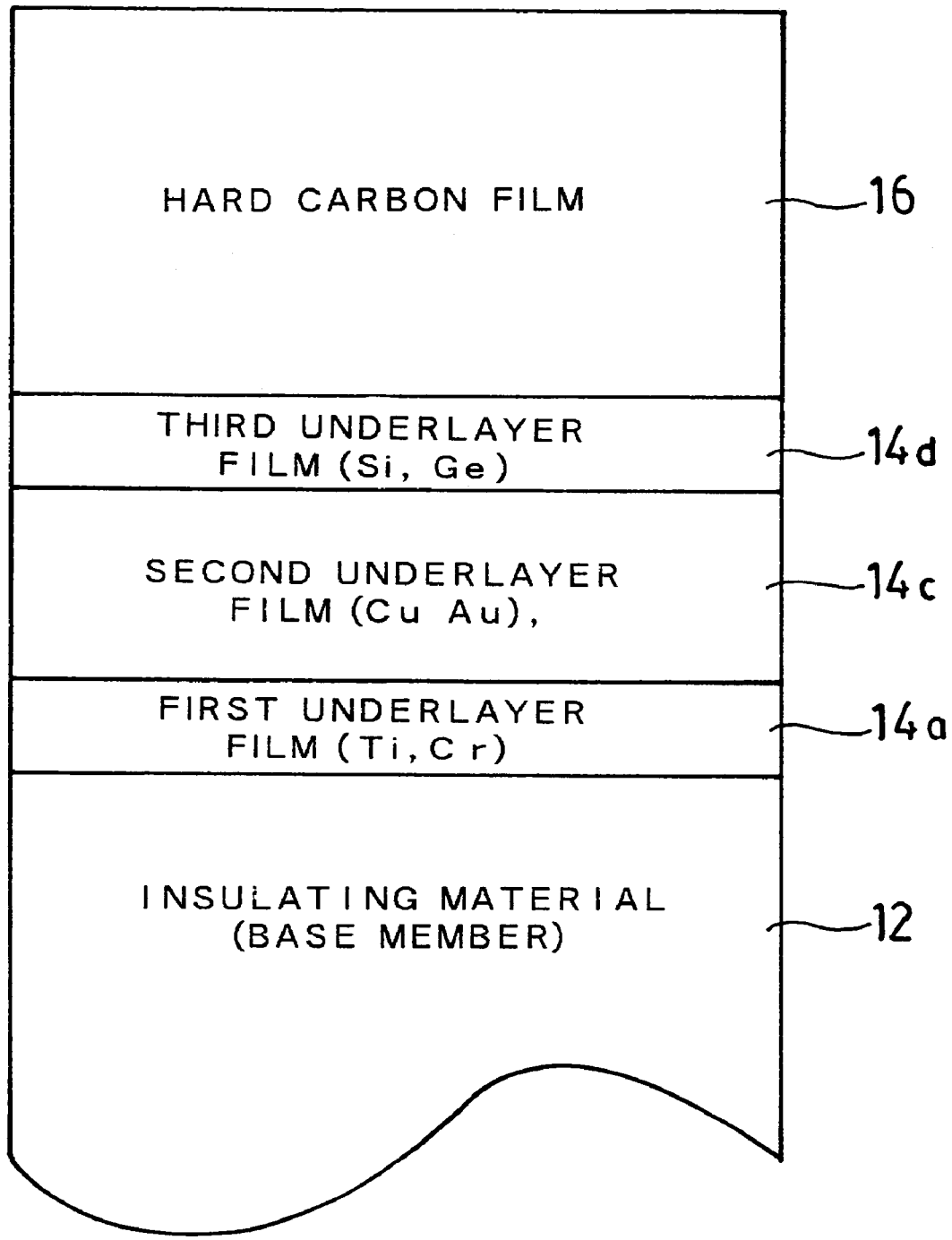
FIG. 5 is a schematic sectional view illustrating the construction of films formed over an insulating material by the third embodiment according to the invention.
Figure 6:
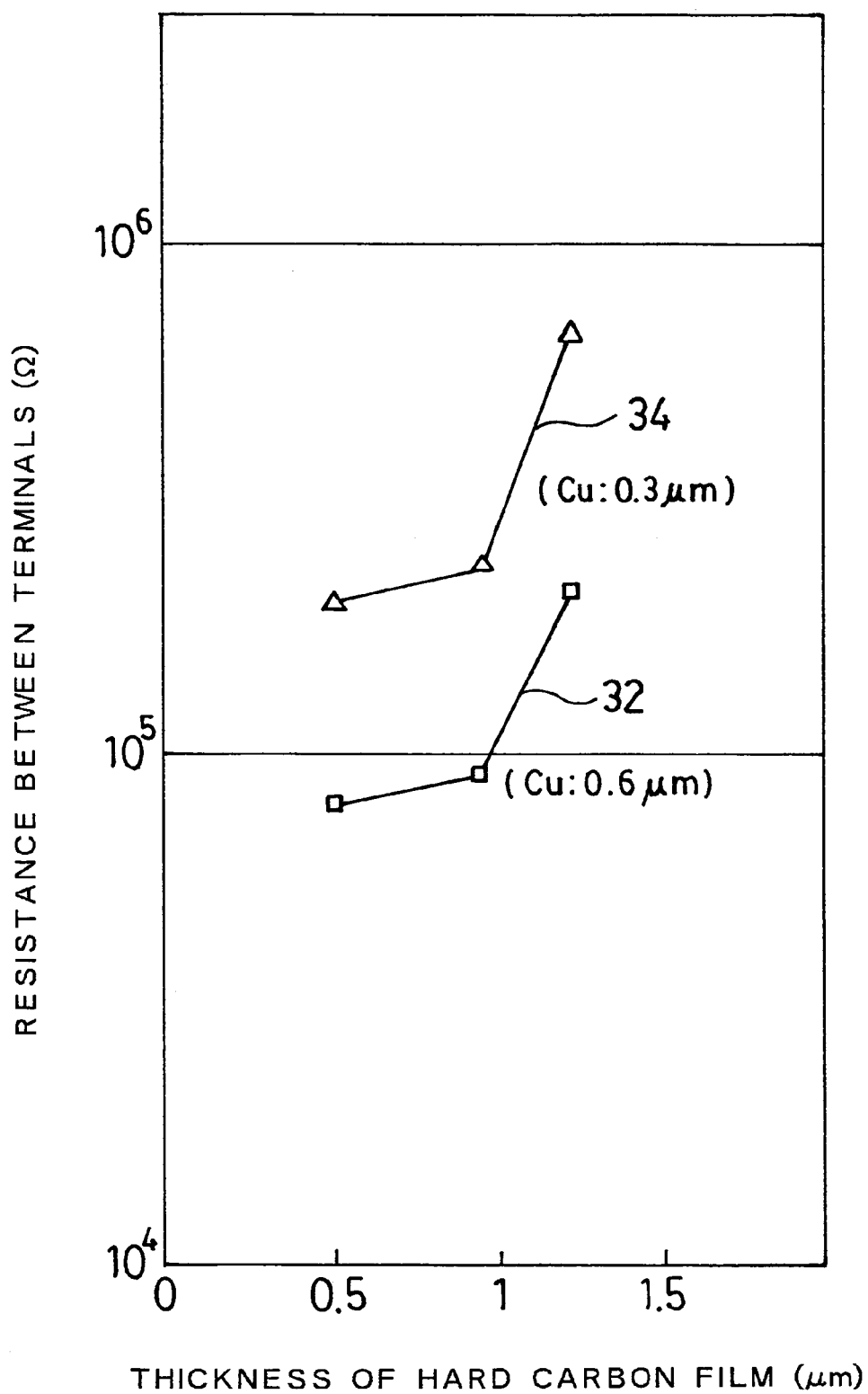
FIG. 6 is a graph showing an example of measurement of surface electrical resistance values and thickness of hard carbon films formed according to the third embodiment.

Third Embodiment: FIGS. 5 and 6

Next, the third embodiment according to the invention will be described hereinafter. FIG. 5 is a schematic sectional view illustrating the construction of the films formed over an insulating material.

In the construction shown in FIG. 5, a hard carbon film 16 is provided via a first underlayer film 14a, second underlayer film 14c, and third underlayer film 14d, formed over an insulating material 12 comprising a base member of various components, jigs, tools, or the like. The insulating material 12 is glass, ceramic, resin (plastics), or the like.

For the first underlayer film 14a, a metal film composed of a metal selected from the group consisting of titanium (Ti), chromium (Cr), tungsten (W), or a compound such as a carbide, nitride, or the like, of one of the aforesaid metals is formed to a thickness in the range of 0.1 to 0.2 $\mu$m on the surface of the insulating material 12.

For the second underlayer film 14c, a metal film composed of a metal selected from the group consisting of gold (Au), copper (Cu), indium (In), aluminum (Al), or the like, having higher electric conductivity than the first underlayer film 14a, is formed to a thickness in the range of 0.5 to 1.0 µm over the first underlayer film 14a.

For the third underlayer film 14d, a semiconductor film composed of silicon, germanium, or the like is formed to a thickness in the range of 0.1 to 0.2 µm over the second underlayer film 14c.

The underlayer films 14a, 14c, and 14d are formed by means of a physical vapor deposition method such as the sputtering method, vacuum deposition method or the like, or the CVD (chemical vapor deposition) method as previously described with reference to the embodiments described hereinbefore.

This embodiment is characterized by having a metal film having high electric conductivity (low specific resistance), as the second underlayer film 14c, interposed between the underlayers, to allow electric current in large amounts to flow therethrough so that the surface electrical resistance value of the hard carbon film 16 can be lowered with ease due to a decrease in the electrical resistance value of the underlayers as a whole.

The first underlayer film 14a, composed of titanium, chromium, or the like, is necessary to enhance adhesion with the insulating material 12 constituting the base member, and the third underlayer film 14d, composed of silicon, germanium, or the like, is necessary to enhance adhesion with the hard carbon film 16.

A specific example of the third embodiment of the invention will be described with reference to a graph in FIG. 6.

The graph shown in FIG. 6 indicates resistance between the measurement terminals, that is, surface electrical resistance values of the hard carbon film 16, with the construction of the films being as shown in FIG. 5, wherein glass is used for the insulating material 12 constituting the base member, a titanium (Ti) film as the first underlayer film 14a, a copper (Cu) film as the second underlayer film 14c, and a silicon (Si) film as the third underlayer film 14d are formed, respectively, on the surface of the insulating material 12, the hard carbon film 16 being formed over the upper surface of the third underlayer film 14d.

Three types of samples provided with a hard carbon film 0.5 µm, 0.9 µm, and 1.2 µm thick, respectively, were prepared, and electrical resistance values of the respective samples between the measurement terminals were measured, the measurement results being plotted in FIG. 6.

In this instance, only the thickness of the copper film, that is, the second underlayer film 14c, was varied, keeping the thickness of both the Ti film, that is, the first underlayer film 14a and the Si film, that is, the third underlayer film 14d, constant (at 0.1 µm).

The curve 32 represents the case of the Cu film being 0.6 µm thick, wherein electrical resistance values of the hard carbon film between the measurement terminals were $8.0\times 10^4$ Ω, $9.0\times 10^4$ Ω, and $2.2\times 10^5$ Ω for the thickness thereof at 0.5 µm, 0.9 µm, and 1.2 µm, respectively.

The curve 34 represents the case of the Cu film being 0.3 µm thick, wherein electrical resistance values of the hard carbon film between the measurement terminals were $2.0\times 10^5$ Ω, $2.4\times 10^5$ Ω, and $6.8\times 10^5$ Ω for the thickness thereof at 0.5 µm, 0.9 µm, and 1.2 µm, respectively.

As is evident from the curves 32 and 34 of the graph shown in FIG. 6, the surface electrical resistance value of the hard carbon film can be controlled with ease by varying the thickness of the second underlayer film 14c, one of the underlayer films, that is, the electrical value of the film.

More specifically, it has been found from comparison of the curve 32 for the case of the Cu film, that is, the second underlayer film, being 0.6 µm thick, with the curve 34 for the case of the same being 0.3 µm thick, that the surface electrical resistance value of the hard carbon film 0.9 µm thick was $9\times 10^4$ Ω, and $2.4\times 10^5$ Ω, respectively. These values show that the surface electrical resistance values (resistance between the measurement terminals) of the hard carbon film according to this embodiment are further lower than the measurement results in the case of the double-layer underlayer films as indicated in FIG. 4.

In this embodiment, the electrical resistance value of the underlayer films is varied by changing primarily the thickness of the second underlayer film 14c so as to control the surface electrical resistance value of the hard carbon film 16. However, the electrical resistance value of the first underlayer film 14a or that of the third underlayer film 14d may alternatively be varied.

The surface electrical resistance value of the hard carbon film 16 formed as described above over the insulating material 12 will be affected by the underlayer films formed in layers thereunder because the thickness of the hard carbon film 16 is as thin as 2 µm or less. More specifically, the electric current flowing through the surface of the hard carbon film 16, that is, between the measurement terminals 22a and 22b shown in FIG. 14, is a composite of the electric current flowing through the hard carbon film 16 and the same flowing through the underlayer films after penetrating through the hard carbon film 16.

Accordingly, the current flowing through the underlayer films can be increased by rendering resistance in the underlayer films lower than that in the hard carbon film with the result that the surface electrical resistance value of the hard carbon film can be reduced. It follows that the surface electrical resistance value of the hard carbon film can be controlled by varying the resistance value of the underlayer films formed in layers underneath the hard carbon film.

It has been found on the basis of results of experiments that the surface electrical resistance value of the hard carbon film bearing the least electrical charge in the surface thereof was around $10^5$ Ω. Accordingly, the electrical resistance value of the underlayer may be controlled such that the surface electrical resistance value of the hard carbon film will be on the order of that number.

System for Use in Carrying Out the Invention: FIGS. 7 to 10

Now, a system for use in carrying out the method of forming films over an insulating material according to the invention will be described hereinafter.

A system for use in carrying out the method of forming films according to the first embodiment of the invention, as illustrated in FIG. 1, will first be described with reference to FIGS. 7 and 8.

Figure 7:
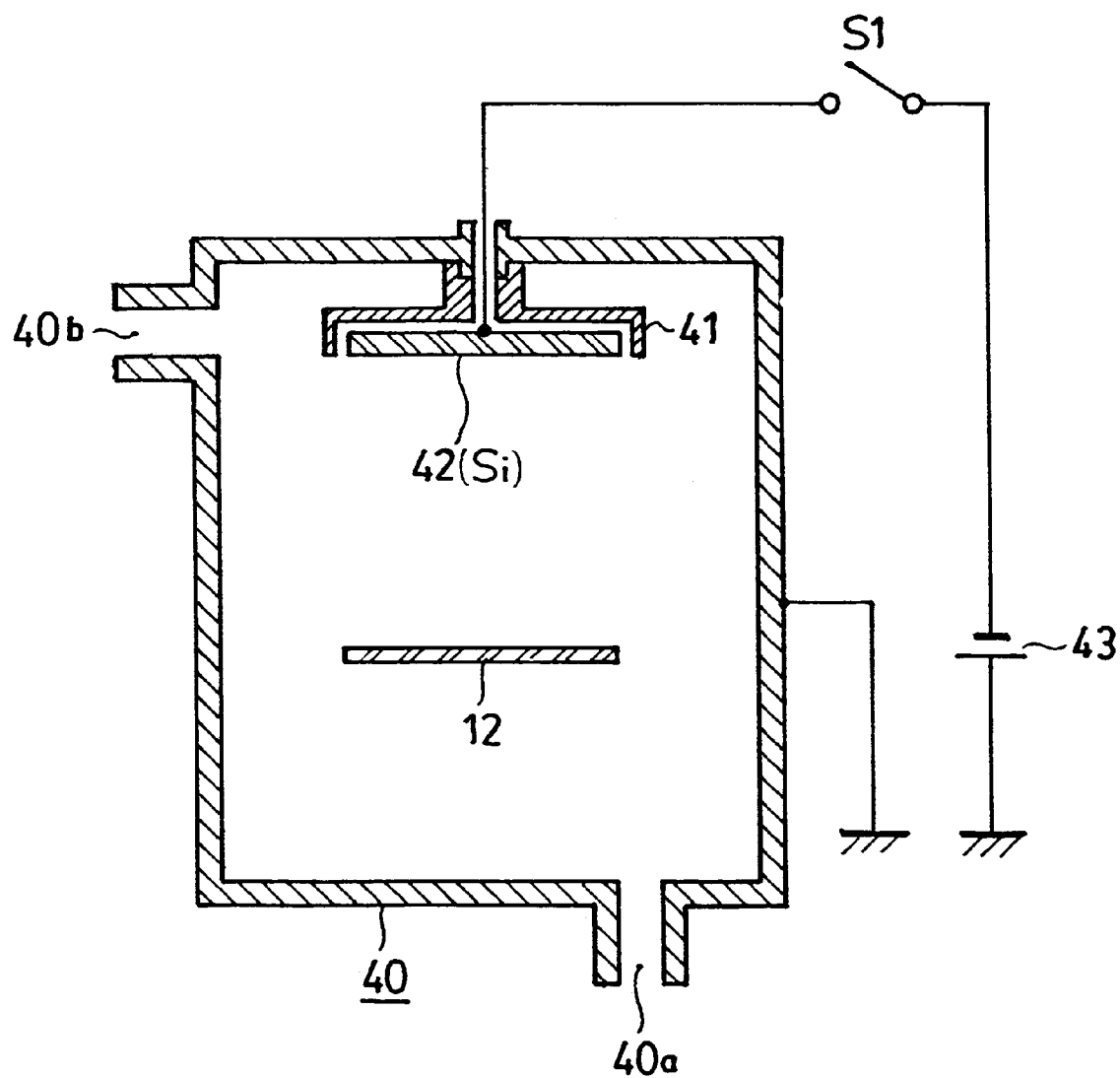
FIG. 7 is a schematic sectional view of a sputtering system for forming a single-layer underlayer film on the surface of an insulating material according to the method of the invention.

FIG. 7 is a schematic sectional view of a sputtering system for forming a single-layer underlayer film on the surface of an insulating material. The sputtering system is constructed such that a ground cover 41 is fixedly mounted on the inside of a vacuum chamber, an n-type silicon material 42 as a target material for forming the underlayer film is securely held by the ground cover 41 via an insulating member (not shown), and an insulating material 12 for constituting a base member is disposed so as to face the n-type silicon material 42.

The vacuum chamber 40 is evacuated by an evacuating means (not shown) through an air outlet 40a to a degree of vacuum on the order of $3\times 10^{-5}$ torr. Thereafter, argon gas as a sputtering gas is fed into the vacuum chamber 40 through a gas inlet 40b, adjusting the degree of vacuum to reach a level on the order of $1\times 10^{-3}$ torr.

At this point in time, both the vacuum chamber 40 and the ground cover 41 are grounded, and with a switch S1 closed, a DC voltage of −600 V supplied from a DC power source 43 is applied to the silicon material 42, thereby causing a plasma to occur in the vacuum chamber 40. The surface of the silicon material 42 is then sputtered by argon ions in the plasma.

Silicon (Si) molecules ejected by the sputtering process described above are deposited on the surface of the insulating material 12. By applying the sputtering process for about 30 minutes, a silicon film as the underlayer film 14 shown in FIG. 1 can be formed to a thickness on the order of 0.5 μm.

The thickness of the silicon film can optionally be adjusted by selecting the length of processing time, thereby varying the electrical resistance value of the silicon film as the underlayer film. Further, it is possible to change the electrical resistance value of the silicon film to be formed by varying the concentration of an impurity (phosphorus, boron, arsenic, or the like) contained in the silicon material 42 for use as the target material.

In the case of forming a germanium film, that is, another semiconductor film, a metal film such as a titanium film, chromium film, tungsten film, or a film composed of a carbide or a nitride of one of these metals, such films can be formed similarly with the use of the sputtering system described in the foregoing by simply changing the target material to be held by the ground cover 41 to a material for the respective film type.

Figure 8:
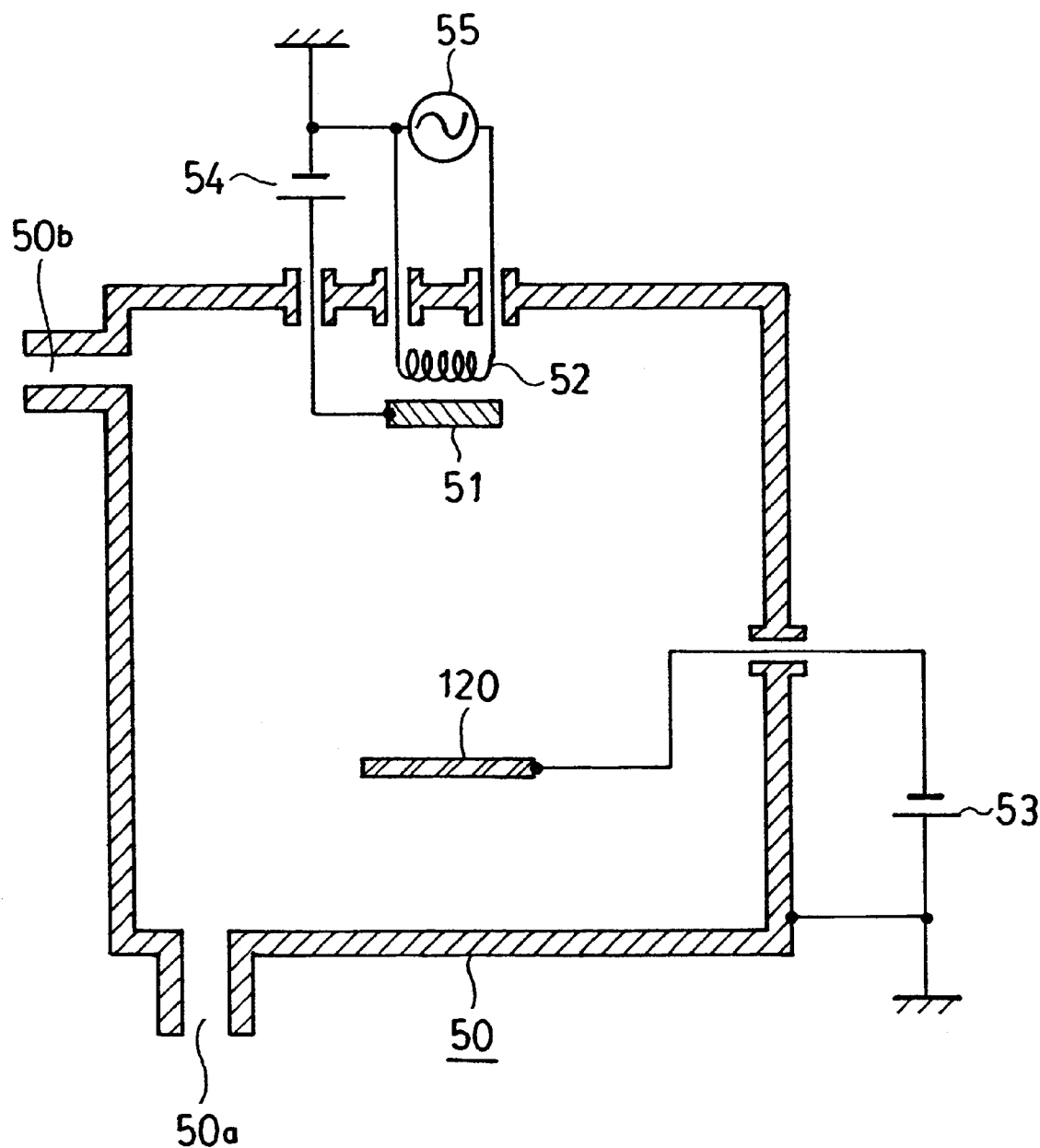
FIG. 8 is a schematic sectional view of a plasma CVD system for forming a hard carbon film over the insulating material with the underlayer film formed thereon, according to the method of the invention.

FIG. 8 is a schematic sectional view of a plasma CVD system for forming a hard carbon film over the insulating material with the underlayer film formed thereon as described above.

In the system, a vacuum chamber 50 having an air outlet 50a and a gas inlet 50b is provided with an anode 51 and a filament 52 in the upper part thereof. The insulating material 120 with the underlayer film formed thereon is disposed inside the vacuum chamber 50, opposite to the anode 51.

Then, the vacuum chamber 50 is evacuated through the air outlet 50a until the degree of vacuum reaches a level on the order of $3 \times 10^{-5}$ torr. Thereafter, benzene ($C_6H_6$) as a carbon-containing gas is fed into the vacuum chamber 50 through the gas inlet 50b, adjusting pressure inside the vacuum chamber 50 to reach a level on the order of $1 \times 10^{-3}$ torr.

The vacuum chamber 50 is then grounded, and a DC voltage of −3 kV supplied from a DC power source 53 is applied to the underlayer film (the silicon film in the case of the example described hereinbefore) of the insulating material 120 while a DC voltage of +50 V supplied from an anode power source 54 is applied to the anode 51 in the vacuum chamber 50, and an AC voltage of 10 V supplied from a filament power source 55 is applied to the filament 52 to cause electric current of 30A to flow therethrough.

As a result, a plasma is caused to occur in a region surrounding the insulating material 120 inside the vacuum chamber 50, and through the plasma CVD process, the hard carbon film composed of hydrogenated amorphous carbon is formed over the underlayer film of the insulating material 120. The thickness thereof can be optionally adjusted by selecting the length of processing time.

As the plasma CVD process whereby the hard carbon film is formed on the surface of the insulating material 120 with the underlayer films formed thereon, there are other methods available such as a method wherein a vacuum chamber not provided with an anode and filament is employed, causing a plasma to occur by applying RF power to the underlayer film of the insulating material 120 disposed inside the vacuum chamber, and a method wherein a plasma is caused to occur simply by applying a DC voltage to the underlayer film of the insulating material 120.

Now, a system for use in carrying out the method of forming the films according to the second embodiment of the invention, as illustrated in FIG. 3, will be described hereinafter with reference to FIG. 9.

Figure 9:
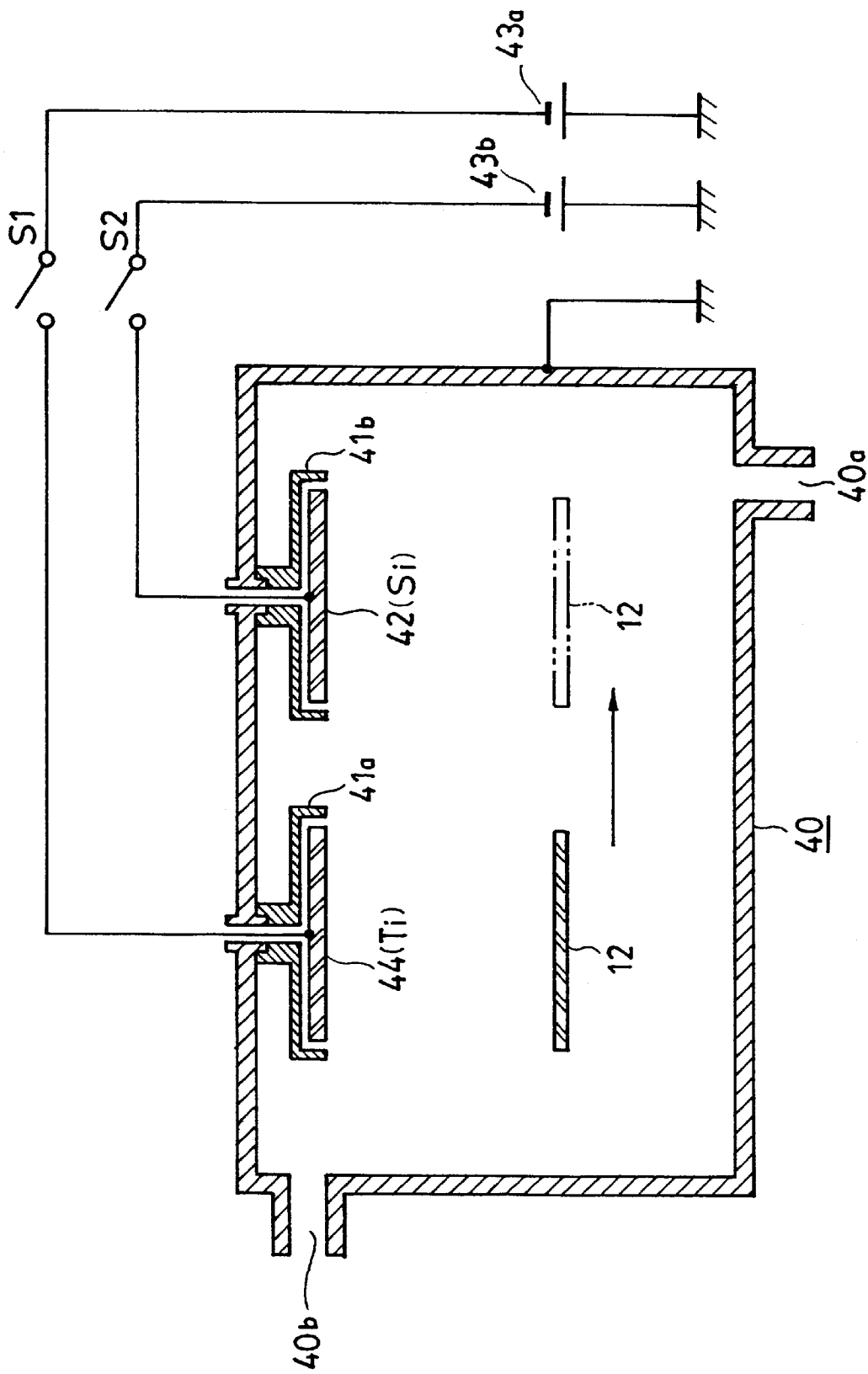
FIG. 9 is a schematic sectional view of a sputtering system for forming double-layer underlayer film on the surface of the insulating material according to the method of the invention.

FIG. 9 is a schematic sectional view of a sputtering system for forming double-layer underlayer film on the surface of an insulating material.

In the system, two ground covers 41a, 41b are disposed inside a vacuum chamber 40, spaced apart from each other. A titanium material 44 for forming the first underlayer film is securely held as a target material by the first ground cover 41a via an insulating member (not shown) while an n-type silicon material 42 for forming the second underlayer film is securely held as a target material by the second ground cover 41b via an insulating member (not shown).

Then, an insulating material 12 for constituting a base member is disposed so as to face the titanium material 44 as shown by the solid lines in FIG. 9. After the vacuum chamber 40 is grounded and evacuated to a preset degree of vacuum in the same way as previously described, argon gas as a sputtering gas is fed therein, a switch S1 is closed, and a DC voltage on the order of −600 V supplied from a DC power source 43a is applied to the titanium material 44.

As a result, a plasma is caused to occur in a region surrounding the titanium material 44 inside the vacuum chamber 40, and the surface of the titanium material 44 is sputtered by argon ions in the plasma.

Titanium (Ti) molecules ejected by sputtering are deposited on the surface of the insulating material 12, forming a titanium film as the first underlayer film 14a shown in FIG. 3. The thickness thereof can be optionally adjusted by selecting the length of processing time.

Subsequently, the switch S1 is opened, and a switch S2 is closed after transferring the insulating material 12 with the first underlayer film 14a formed thereon to a position opposite the silicon material 42 as the target material as shown by the imaginary lines in FIG. 9, and applying a DC voltage around −600 V supplied from a DC power source 43b to the silicon material 42.

Then, in the same way as in the preceding step, the sputtering process is applied to the silicon material 42, forming a silicon film as the second underlayer film 14b over the first underlayer film 14a covering the insulating material 12, as shown in FIG. 3. The thickness thereof can be optionally adjusted by selecting the length of processing time, and the electrical resistance value of the silicon film to be formed can also be controlled according to the concentration of impurity contained therein by varying the concentration of the impurity added to the silicon material 42 used as the target material.

In the case of employing another metal film for the first underlayer film, or another semiconductor film for the second underlayer film, these films can be similarly formed simply by changing respective target materials.

In the example shown in FIG. 9, the DC power sources 43a, 43b are separately installed so that voltages applied to the titanium material 44 and the silicon material 42, respectively, can be optimized. However, a common DC power source may be adopted instead. In this case, the DC power source preferably should be designed so as to be able to regulate an output voltage as necessary.

The method of forming the hard carbon film 16 over the second underlayer film 14b after the first and second underlayer films 14a, 14b are formed on the surface of the insulating material 12 as shown in FIG. 3 is the plasma CVD process employing the same system as described in the case of the embodiment previously described with reference to FIG. 8, and explanation thereof is therefore omitted.

Now, a system for use in carrying out the method of forming the films according to the third embodiment of the invention, as illustrated in FIG. 5, will be described hereinafter with reference to FIG. 10.

Figure 10:
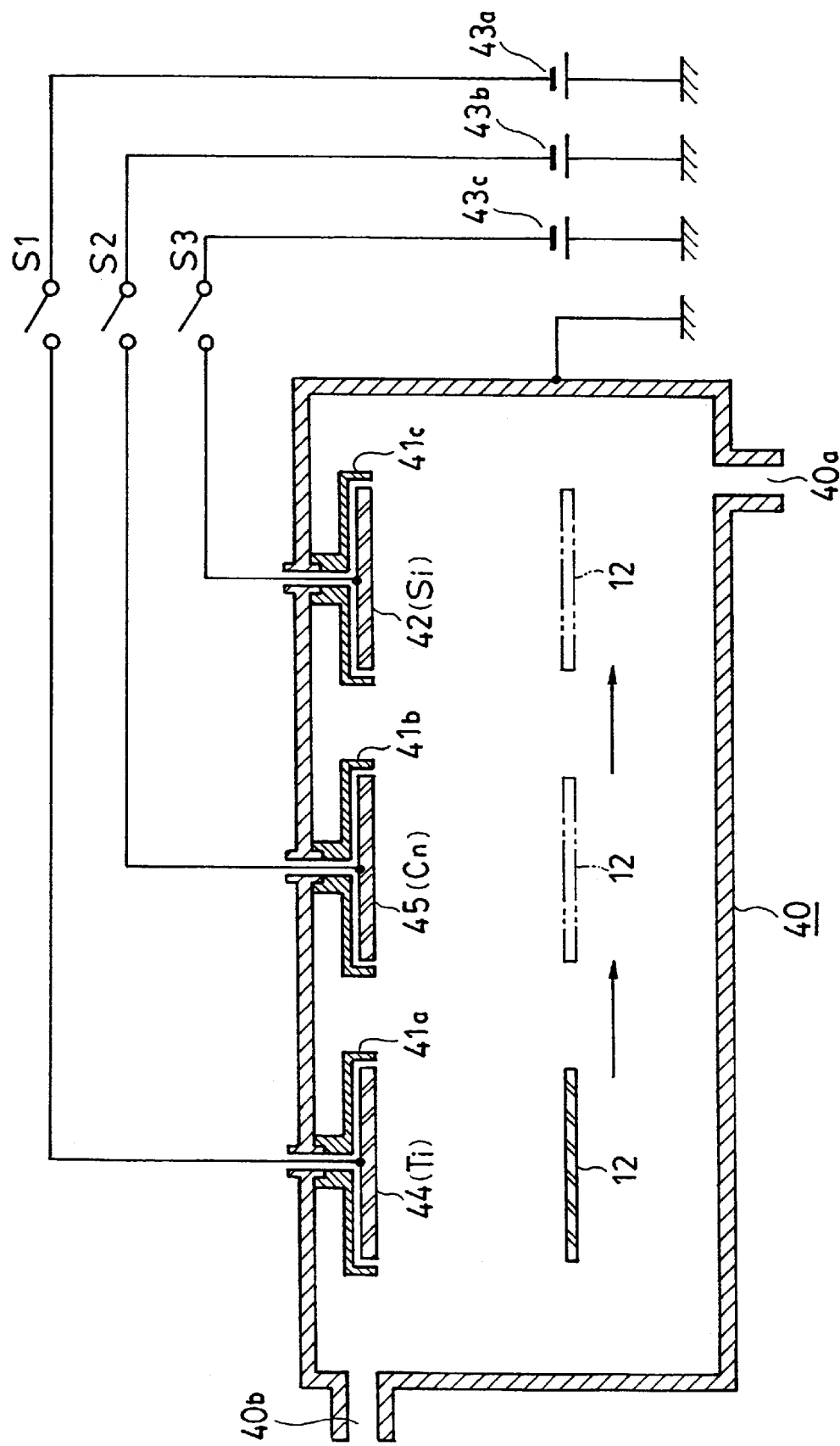
FIG. 10 is a schematic sectional view of a sputtering system for forming triple-layer underlayer film on the surface of the insulating material according to the method of the invention.

FIG. 10 is a schematic sectional view of a sputtering system for forming triple-layer underlayer film on the surface of an insulating material. In the system, three ground covers 41a, 41b, 41c are disposed inside a vacuum chamber 40, spaced apart from each other.

A titanium material 44 as a target material for forming a first underlayer film is securely held by a first ground cover 41a via an insulating member (not shown), a copper material 45 as a target material for forming a second underlayer film is securely held by a second ground cover 41b via an insulating member, and an n-type silicon material 42 as a target material for forming a third underlayer film is securely held by a third ground cover 41c via an insulating member.

Then, an insulating material 12 for constituting a base member is first disposed so as to face the titanium material 44 as shown by the solid lines in FIG. 10. After evacuating the vacuum chamber 40, already grounded, to a degree of vacuum in the same way as previously described, argon gas as a sputtering gas is fed therein, a switch S1 is closed, and a DC voltage on the order of −600 V supplied from a DC power source 43a is applied to the titanium material 44.

Thus, the sputtering process is applied to the titanium material 44 in the same way as in the preceding step, and a titanium film as the first underlayer film 14a shown in FIG. 5 can be formed. The thickness thereof can be optionally adjusted by selecting the length of processing time.

Subsequently, the switch S1 is opened, a switch S2 is closed after transferring the insulating material 12 with the first underlayer film 14a formed thereon to a position opposite the copper material 45 as the target material as shown by the phantom lines in FIG. 10 by use of a transfer means (not shown), and a DC voltage of around −600 V supplied from a DC power source 43b is applied to the copper material 45.

As a result, the sputtering process is applied to the copper material 45, forming a copper film as the second underlayer film 14b over the first underlayer film 14a as shown in FIG. 5. The thickness thereof can be optionally adjusted by selecting the length of processing time.

Thereafter, the switch S2 is opened, a switch S3 is closed after transferring the insulating material 12 with the first underlayer film 14a and the second underlayer film 14b formed thereon to a position opposite the silicon material 42 as the target material as shown by the imaginary lines (on the extreme right side) in FIG. 10 by use of a transfer means (not shown), and a DC voltage of around −600 V supplied from a DC power source 43c is applied to the silicon material 42.

Thus, the sputtering process is applied to the silicon material 42 in the same way as for the preceding case, forming a silicon film as the third underlayer film 14d over the second underlayer film 14c covering the insulating material 12, as shown in FIG. 5. The thickness thereof can be optionally adjusted by selecting the length of processing time, and the electrical resistance value of the silicon film to be formed can also be controlled according to the concentration of impurity contained therein by varying the concentration of an impurity added to the silicon material 42 used as the target material.

In the example shown in FIG. 10, the DC power sources 43a, 43b, 43c are separately installed so that voltages applied to the titanium material 44, copper material 45, and silicon material 42, respectively, can be optimized. However, a DC common power source may be adopted instead. In this case, the DC power source preferably should be designed so as to be able to regulate an output voltage as necessary.

The method of forming the hard carbon film 16 over the third underlayer film 14d after the first, second, and third underlayer films 14a, 14c, 14d are formed on the surface of the insulating material 12 as shown in FIG. 5 is the plasma CVD process employing the same system as described in the case of the embodiment previously described with reference to FIG. 8, and explanation thereof is therefore omitted.

Figure 11:
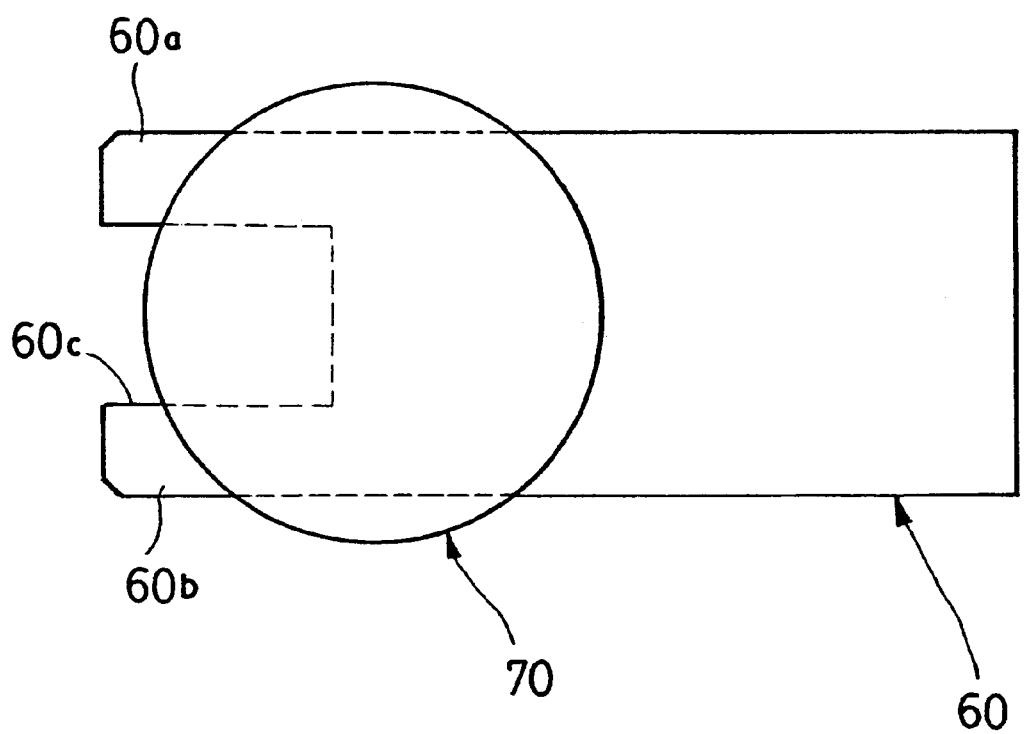
FIG. 11 is a plan view illustrating a state in which a semiconductor wafer is mounted on a transfer arm for semiconductor wafers to which the method of the invention is applied.
Figure 12:
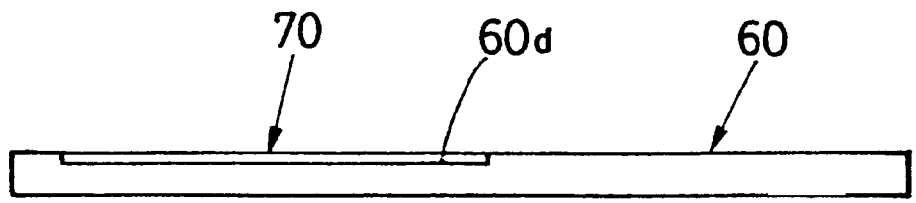
FIG. 12 is a side view thereof.

Application Examples of the Invention: FIGS. 11 and 12

Now, application examples of the invention will be described with reference to FIGS. 11 and 12.

FIG. 11 is a plan view of a transfer arm for semiconductor wafers, to which the invention is applied, illustrating a state wherein a semiconductor wafer is mounted thereon, and FIG. 12 a side view thereof.

The transfer arm 60 has a notched portion 60c formed on the tip thereof, and is provided with arm-like portions 60a, 60b, extended on the opposite sides of the notched portion 60c, forming a depression 60d for fitting a semiconductor wafer 70 therein on the upper surface thereof.

By shifting the transfer arm 60 mounted on a transfer means (not shown), the semiconductor wafer 70 fitted into the depression 60d is transferred between processing steps.

The base member of the transfer arm 60 is composed of ceramic which is an insulating material, the underlayer film according to one of the embodiments of the invention described hereinbefore is formed on the surface of the insulating material, and the hard carbon film is further formed on the surface of the underlayer film.

Accordingly, there is neither any risk of the semiconductor wafer being contaminated by the transfer arm, unlike the case of employing a transfer arm made of a metal material alone, nor any risk of the surface of the transfer arm generating fine particles due to abrasion thereof caused by sliding contact with the semiconductor wafer because the surface of the transfer arm coated with the hard carbon film has very high wear resistance. Furthermore, there is no risk at all of the surface of the transfer arm being charged with static electricity, attracting dust in the atmosphere, or destroying any integrated circuit formed on the semiconductor wafer because of a reduction in the surface electrical resistance of the hard carbon film down to the order of $10^5$ Ω due to the effect of the underlayer having electric conductivity.

The invention is applicable to all of the various components, jigs, and tools that have a base member composed of an insulating material, and that are required to have a surface with very high wear resistance and yet to have not-so-high surface electrical resistance values. In particular, the method of the invention is quite effective when applied to jigs and tools for handling semiconductor wafers and chips described above.

As examples of the jigs and tools for handling the semiconductor wafers and chips besides the transfer arm described above, there can be cited a wafer cassette for holding a multitude of semiconductor wafers, spaced apart from each other, while various treatments are applied thereto, a wafer stage on which semiconductor wafers are placed, a vacuum adsorber for transferring semiconductor chips and the like by adsorbing the same, a pair of tweezers for picking up and taking out the same, and the like.

The wafer stage is used for placing semiconductor wafers thereon when applying a photo resist to the semiconductor wafers by use of the spin coating method, applying an exposure treatment to the photo resist by use of a photo mask, injecting impurity ions, applying a dry etching process, or the like.

The invention may also be applied to guides of apparatuses and components for handling semiconductor wafers and chips, which come in sliding contact with the same.

The insulating material constituting the base member is not limited to ceramic, and glass, plastics, or the like may be alternatively used.

Effect of the Invention

As described in the foregoing, with the method of forming the films over an insulating material according to the invention, the surface hardness of the insulating material can be enhanced and the wear resistance thereof can be dramatically improved by forming the hard carbon film on the surface of the insulating material, while the surface electrical resistance of the hard carbon film can be controlled at a value lower than previously possible by forming the underlayer films having electric conductivity, thereby preventing the surface from being charged with static electricity with the result that a risk of dust in the atmosphere being attracted by the surface, or of articles coming in contact with the surface being damaged, can be eliminated.

In particular, the invention, when applied to jigs and tools for handling semiconductor wafers and chips, can ensure prevention of an accident such as destruction of an integrated circuit formed on the semiconductor wafers and chips caused by static electricity with which the surfaces of the jigs and tools are charged.

What is claimed is:

1. A method of forming films over an insulating material comprising steps of:
   forming an underlayer film of a metal, a metal carbide, a metal nitride or a semiconductor on a surface of the insulating material; and
   forming a diamond-like carbon film over the underlayer film, a surface electrical resistance value of the diamond-like carbon film being controlled by varying an electrical resistance value of the underlayer film.

2. A method of forming films over an insulating material according to claim 1 wherein a metal film is formed as the underlayer film.

3. A method of forming films over an insulating material according to claim 1 wherein a semiconductor film is formed as the underlayer film.

4. A method of forming films over an insulating material according to claim 1 wherein a first underlayer film of a metal film is formed on the surface of the insulating material, and a second underlayer film of a semiconductor film is formed over the first underlayer film, the two films constituting the underlayer film.

5. A method of forming films over an insulating material according to claim 2 wherein the electrical resistance value of the underlayer film is varied by changing the thickness of the metal film.

6. A method of forming films over an insulating material according to claim 3 wherein the electrical resistance value of the underlayer film is varied by changing the thickness of the semiconductor film.

7. A method of forming films over an insulating material according to claim 3 wherein the electrical resistance value of the underlayer film is varied by changing a concentration of an impurity added to the semiconductor film.

8. A method of forming films over an insulating material according to claim 4 wherein the electrical resistance value of the underlayer film is varied by changing at least either of a thickness of the first underlayer film of the metal film or that of the second underlayer film of the semiconductor film.

9. A method of forming films over an insulating material according to claim 4 wherein the electrical resistance value of the underlayer film is varied by changing at least either of a thickness of the first underlayer film of the metal film or concentration of an impurity added to the second underlayer film of the semiconductor film.

10. A method of forming films over an insulating material according to claim 1 wherein the underlayer film is formed of a metal selected from the group consisting of titanium, chromium and tungsten; or a carbide or a nitride of any metal among said metals.

11. A method of forming films over an insulating material according to claim 3 wherein the semiconductor film as the underlayer film is formed of a material selected from the group consisting of silicon, germanium, and a compound of silicon or germanium.

12. A method of forming films over an insulating material according to claim 4 wherein the first underlayer film of the metal film is formed of a metal selected from the group consisting of titanium, chromium, and tungsten, while the second underlayer film of the semiconductor film is formed of either silicon or germanium.

13. A method of forming films over an insulating material according to claim 1 wherein a first underlayer film of a metal film is formed on the surface of the insulating material, a second underlayer film of a metal film having higher electric conductivity than that of the metal film is formed over the first underlayer film, and a third underlayer film of a semiconductor film is further formed over the second underlayer film, the three films constituting the underlayer film.

14. A method of forming films over an insulating material according to claim 13 wherein the surface electrical resistance value of the underlayer film is changed by varying primarily the thickness of the second underlayer film.

15. A method of forming films over an insulating material according to claim 13 wherein the first underlayer film is formed of a metal selected from the group consisting of titanium, chromium, and tungsten, the second underlayer film is formed of a metal selected from the group consisting of gold, copper, indium, and aluminum, and the third underlayer film is formed of either silicon or germanium.

16. A method of forming films over an insulating material according to claim 1 wherein the insulating material is composed of either glass or ceramic.

17. A method of forming films over an insulating material according to claim 1 wherein the insulating material comprises a jig or tool for handling semiconductor wafers or chips.

18. A method of forming films over an insulating material according to claim 1 wherein the insulating material comprises a jig or tool for handling semiconductor wafers or chips, composed of either glass or ceramic.

19. A method of forming films over an insulating material according to claim 18 wherein a metal film is formed as the underlayer film, the electrical resistance value of the underlayer film being changed by varying the thickness of the metal film.

20. A method of forming films over an insulating material according to claim 18 wherein a semiconductor film is formed as the underlayer film, the electrical resistance value of the underlayer film being changed by varying the thickness of the semiconductor film or a concentration of an impurity added thereto.

21. A method of forming films over an insulating material according to claim 18 wherein a first underlayer film of a metal film is formed on the surface of a transfer arm comprising the insulating material, and a second underlayer film of a semiconductor film is formed over the first underlayer film, the two films constituting the underlayer film, the electrical resistance value of which is changed by varying either the thickness of the first underlayer film of the metal film, or the thickness or a concentration of an impurity of the second underlayer film of the semiconductor film.

22. A method of forming films over an insulating material according to claim 18 wherein a first underlayer film of a metal film is formed on the surface of a transfer arm comprising the insulating material, a second underlayer film of a metal film having higher electric conductivity than that of the metal film is formed over the first underlayer film, and a third underlayer film of a semiconductor film is further formed over the second underlayer film, the three films constituting the underlayer film, the electrical resistance value of which is changed by varying primarily the thickness of the second underlayer film.

* * * * *